United States Patent [19]

Voss et al.

[11] Patent Number: 4,950,985
[45] Date of Patent: Aug. 21, 1990

[54] APPARATUS FOR MEASURING ELECTROMAGNETIC VALUES OF A COIL, IN PARTICULAR FOR MEASURING THE POSITION OF ARMATURE OF A COIL/ARMATURE MAGNETIC SYSTEM

[75] Inventors: Thomas Voss, Tettnang; Peter Winterhalter, Schlichten; Günter Feier, Schorndorf, all of Fed. Rep. of Germany

[73] Assignee: Herion-Werke KG, Fellbach, Fed. Rep. of Germany

[21] Appl. No.: 280,704

[22] Filed: Dec. 6, 1988

[30] Foreign Application Priority Data

Dec. 9, 1987 [DE] Fed. Rep. of Germany ....... 3741734

[51] Int. Cl.$^5$ ...................... G01B 7/14; H01H 47/00; G01R 27/26
[52] U.S. Cl. ......................... 324/207.16; 324/207.22; 324/207.24; 324/655; 340/686; 361/170
[58] Field of Search ............... 324/207, 208, 234, 236, 324/207.16, 207.22, 207.24, 652, 655, 682; 340/686, 870.31, 870.32, 870.33; 361/170, 179, 180; 137/554

[56] References Cited

U.S. PATENT DOCUMENTS

| 3,477,018 | 11/1969 | Richardson et al. | 324/236 X |
| 3,789,876 | 2/1974 | Kempton et al. | 340/686 X |
| 3,851,242 | 11/1974 | Ellis | 324/236 |
| 4,284,961 | 8/1981 | Landau | 324/208 X |
| 4,809,742 | 3/1989 | Grau | 324/208 X |
| 4,835,471 | 5/1989 | Kutilin | 324/236 |

Primary Examiner—Gerard R. Strecker
Attorney, Agent, or Firm—Henry M. Feiereisen

[57] ABSTRACT

An apparatus for measuring the electromagnetic values of a coil, in particular for measuring the position of the armature of a coil/armature magnetic system includes a capacitor connected parallel at an arbitrary location to a supply line for the coil so as to define a parallel resonant circuit containing inductance of the coil and capacitance of the capacitor. An exciting frequency is introduced into the parallel resonant circuit by a transducer which is connected to the supply line. In addition, an evaluation instrument is connected to the supply line for determining the resonant frequency of the parallel resonant circuit and thus the position of the armature of the coil/armature magnetic system.

12 Claims, 2 Drawing Sheets

APPARATUS FOR MEASURING ELECTROMAGNETIC VALUES OF A COIL, IN PARTICULAR FOR MEASURING THE POSITION OF ARMATURE OF A COIL/ARMATURE MAGNETIC SYSTEM

BACKGROUND OF THE INVENTION

The present invention refers to an apparatus for measuring electromagnetic values of a coil, in particular for measuring the position of armature of a coil/armature magnetic system.

It is known to use various switches and sensors for measuring the position of the armature of a coil/armature magnetic system or the electromagnetic values of a coil. For example, inductive or capacitive proximity switches have been used to determine a certain position of the armature. Further, position sensors e.g. Hall probes or similar components have been described. For determining electromagnetic values of a coil, there are known various measuring circuits. However, apart from the fact that the measurements are partly dependent on the supply voltage and the surrounding temperature and thus inaccurate, the known proposals usually allow determination of only one or two positions of the armature, generally the end positions of the same. The switches or sensors used for the measurement are either directly attached to the armature the position of which is to be determined or at least have to be arranged in immediate vicinity of the latter. By virtue of these drawbacks, a miniaturization of measuring devices is not possible nor is it feasible to provide the measuring device at a spatial distance from the armature or coil.

SUMMARY OF THE INVENTION

It is thus an object of the present invention to provide an apparatus for measuring the electromagnetic values of a coil, in particular the position of armature of a coil/armature magnetic system obviating the aforestated drawbacks.

This object and others which will become apparent hereinafter are attained in accordance with the present invention by connecting one capacitor parallel at an arbitrary location to a supply line for the coil so as to define a parallel resonant circuit containing inductance of the coil and capacitance of the capacitor wherein an exciting frequency is introduced into the parallel resonant circuit by a generator which is connected to the supply line, and the resonant frequency of the parallel resonant circuit is determined by an evaluation instrument which is connected to the supply line for the coil.

Through the provision of a measuring apparatus in accordance with the present invention, the magnetic system, i.e. the coil does not require any constructive alterations or additions such as sensors in order to continuously determine the position of the armature or the magnetic values of the coil. The measuring apparatus can simply be connected to the supply line of the magnetic system at any arbitrary location thereof which supply line is anyway part of the system. Taking as an example an electromagnet as coil/armature magnetic system, the end positions and all intermediate positions of the armature can be interrogated so that the armature can be continuously monitored and if necessary adjusted.

BRIEF DESCRIPTION OF THE DRAWING

The above and other objects, features and advantages of the present invention will now be described in more detail with reference to the accompanying drawing in which.

DETAILED DESCRIPTION OF PREFERRED EMBODIMENTS

Figure 1:
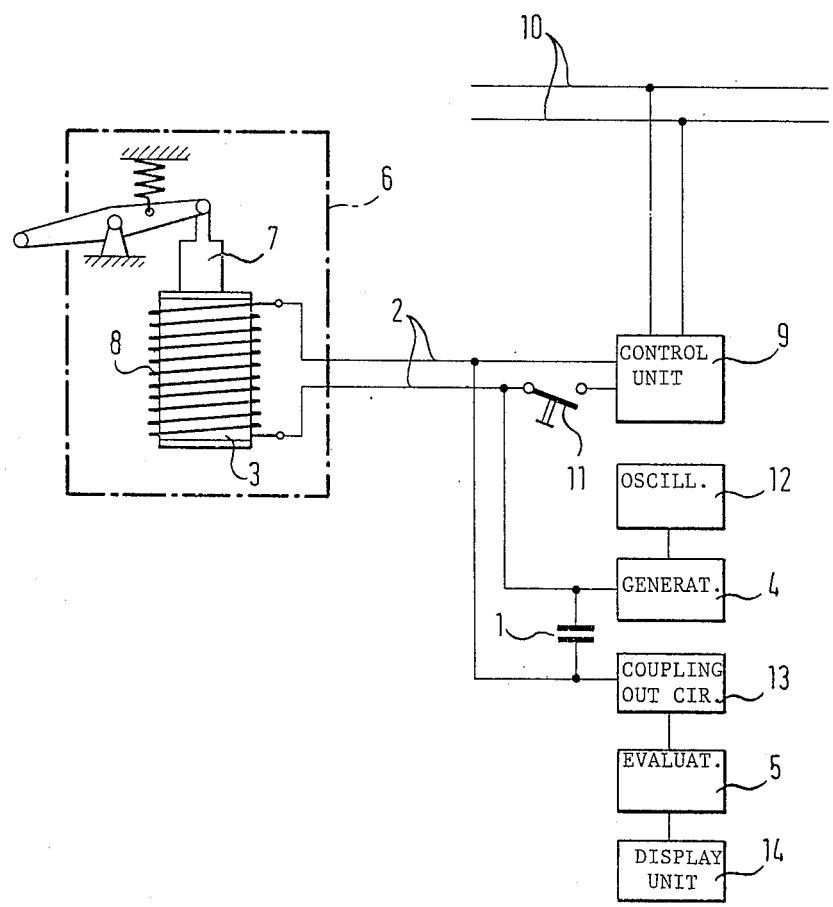
FIG. 1 is a schematic illustration of a circuit diagram of a first embodiment of a measuring apparatus in accordance with the invention.

Referring now to the drawing, and in particular to FIG. 1, there is shown a circuit diagram of a first embodiment of a measuring apparatus in accordance with the present invention for determining electromagnetic values of a coil, in particular for determining the position of armature of a coil/armature magnetic system. Designated by reference numeral 6 is an arbitrary device which includes an electromagnet 3. In the nonlimiting example of FIG. 1, the electromagnet 3 is a d.c. magnet with a coil 8 e.g. a sensor coil through which direct current flows, and with an armature or plunger 7 which reciprocates within and along the axis of the coil 8. The coil 8 has an inductance which varies in dependence on the position of the armature 7. It will be appreciated that the electromagnet may certainly also be of the a.c. magnet type.

Connected to the coil 8 is a supply line 2 which cooperates with a control unit 9 such as e.g. a power pack connected to the electric supply mains 10 for feeding the coil 8 with current whenever the electromagnet 3 should be energized. Interposed in the supply line 2 is a switch 11 which is actuated for energizing the electromagnet 3.

Connected parallel to the supply line 2 at an arbitrary location is a capacitor 1 which has a capacitance considerably exceeding the capacitance of the supply line 2 and defining with the inductance of the coil 8 of the electromagnet 3 a parallel resonant circuit. Since the capacitance of the capacitor 1 remains constant, the resonant frequency of the parallel resonant circuit is dependent on the position of the armature 7 of the electromagnet 3 and thus is a function of the inductance.

In the nonlimiting example of FIG. 1, an oscillator 12 supplies a voltage of predetermined frequency to a generator, such as e.g. a frequency generator or impulse generator 4 the output of which is connected to the supply line 2 so as to introduce an exciting frequency into the resonant circuit. As the capacitance remains constant, the resonant frequency of the resonant circuit is solely dependent on the inductance and yields a response function which allows determination of the position of the armature 7 of the electromagnet 3 e.g. determination of both end positions of the armature 7 in the excited or non-excited state of the electromagnet 3 or every intermediate position of the armature 7. The resonant frequency is identified by an evaluator 5 which includes any device capable of recognizing and interpreting the various signals from the resonant circuit in response to the test signals introduced into the resonant circuit and to determine on the basis of these response signals the position of the armature. An example of a generator is an impulse generator which may provide a time analysis of the oscillation. The evaluator 5 is connected to the supply line 2 of the electromagnet 3 via a coupling out circuit 13 which is a circuit by which the response of the circuit to the introduction of the signal is coupled out or removed from the circuit without a following response signal interfering with the measuring circuit. A possible example of a coupling out circuit is a suitable buffer amplifier which removes the signal from the resonant circuit and feeds it to the evaluator 5. The evaluator 5 cooperates with a display unit 14 by which the determined position of the armature 7 can be made visible or displayed.

Figure 2:
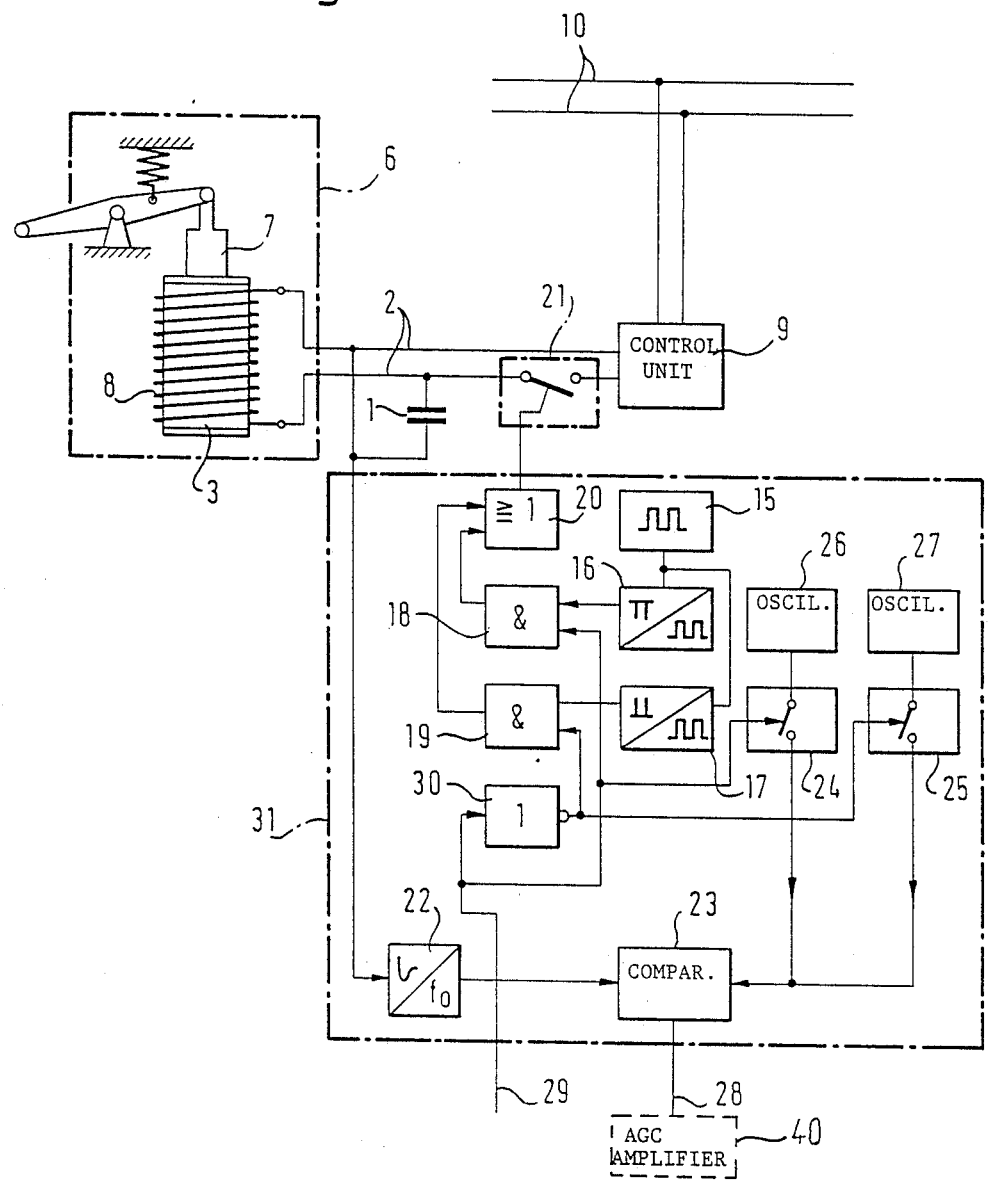
FIG. 2 is a schematic illustration of a circuit diagram of a second embodiment of a measuring apparatus in accordance with the invention.

Turning now to FIG. 2, there is shown a second embodiment of a measuring apparatus in accordance with the present invention for monitoring the positions of the armature 7 of the electromagnet 3 whereby same reference numerals have been used for identifying same elements as illustrated in FIG. 1.

In the nonlimiting example of FIG. 2, an oscillator 15 generates a square-wave voltage which is converted in negative needle pulses or positive needle pulses by respective converters 16, 17. The needle pulses are introduced via gate circuits 18, 19, an OR-gate 20 and a switching element 21 in form of e.g. a transistor into the parallel resonant circuit containing the inductance of the coil 8 and the capacitance of the capacitor 1.

In the event the electromagnet 3 is excited, the negative needle pulses cause a breaking of the parallel resonant circuit while in case the electromagnet 3 is not excited, the resonant circuit is switched on by the positive needle pulses. It will be appreciated that in comparison with the inertia of the armature 7 of the electromagnet 3, the needle pulses are of such short time period that the armature 7 is not influenced in any way by the needle pulses.

Switching of the electromagnet 3 is attained via drive line 29 and an inverter 30, and in each switching state of the electromagnet 3 the respective frequency of the parallel resonant circuit is determined based on its impulse response function or step-function response. Accordingly, the supply line 2 for the electromagnet 3 is connected to a converter 22 the output of which is linked to one input of a comparator 23. The other input of the comparator 23 receives a desired frequency from oscillators 26, 27 via respective switching elements 24, 25. Via its output, the comparator 23 provides a status signal in correspondence with the instantaneous position of the armature 7 of the electromagnet 3.

Advantageously, the comparator 23 may be designed in microcomputer technique in which the converter 22, the oscillators 26, 27 and the switching elements 24, 25 are contained. In addition, it is possible to provide an evaluation electronic 31 in form of a microcomputer in which the oscillators 26, 27, the switching element 24, 25, the oscillator 15, the converters 16, 17, the gate circuits 18, 19, the OR-gate 20, the inverter 30, the converter 22 and the comparator 23 are contained.

In order to eliminate external disturbances such as e.g. thermal effects, stochastic influences and signal pick ups may distort the measurement and to maintain accurate measurements, the microcomputer may be equipped with protection methods which may be executed in form of plausibility analysis or tendency analysis. It is also conceivable to provide additional algorithms for eliminating external disturbances. For correctly interpreting the received response signals from the resonant circuit, these protection methods may employ a number of single measurements of the response signal based on which the microprocessor determines an average probable value. By using an algorithm, the microprocessor recognizes measuring values which are only within a tolerable range and ignores those outside this range such as e.g. voltage spikes. In the plausibility analysis, the microprocessor recognizes a response signal from the resonant circuit only within a window which is defined by the time or the voltage of the response. A response outside this window is characterized by the microprocessor as implausible and thus not referred to when averaging the single measurements. To perform a tendency analysis, the microprocessor utilizes a temperature raise during supply of electricity of the coil which results in an increase of the resistance and in an increased damping of the resonant circuit. Again, the microprocessor uses a window within which the response signal is recognized.

With the present invention, upon a continuously energized electromagnet, the position of its armature can continuously be determined to thereby allow an accurate control of the armature movement. The electromagnet is energized by its drive current, and the instantaneous resonant frequency of the parallel resonant circuit is compared in the comparator 23 with the desired frequency. The status signal for the armature 7 of the electromagnet 3 is fed via line 28 to a suitable AGC amplifier 40 which is indicated in broken lines and whose output provides the armature current for the electromagnet so that the position of the armature 7 can continuously be controlled by using the desired frequency as command variable.

It will be appreciated that in the described measuring method, the ohmic resistance of the coil 8 and the line resistance is essentially negligible. By suitably dimensioning the capacitance of the capacitor 1, the capacitive disturbances e.g. in form of line capacitance of the supply line 2 can also be neglected.

While the invention has been illustrated and described as embodied in a Apparatus for Measuring Electromagnetic Values of a Coil, in particular for Measuring the Position of Armature of a Coil/Armature Magnetic System, it is not intended to be limited to the details shown since various modifications and structural changes may be made without departing in any way from the spirit of the present invention.

What is claimed as new and desired to be protected by Letters Patent is set forth in the appended claims:

1. Apparatus for measuring the position of armature of a coil/armature magnetic system, comprising:
   a power source with a supply line for supplying energizing current to the coil of the coil/armature system;
   at least one capacitor connected parallel to said supply line so as to define a parallel resonant circuit containing inductance of said coil and capacitance of said capacitor, said resonant circuit having a resonant frequency which depends on the inductance of said coil;
   generating means connected to said supply line for introducing into said parallel resonant circuit an additional signal in form of an impulse without becoming attenuated so as to retain its strength and to be independent of the distance between the point of signal introduction and said coil, said parallel resonant circuit producing in response to said additional signal a response signal which is a function of said resonant frequency; and an evaluator connected to said supply line for interpreting said response signal to thereby determine the armature position.

2. Apparatus as defined in claim 1, and further comprising an oscillator connected to the input of said generating means for delivering a voltage of predetermined frequency.

3. Apparatus as defined in claim 1, and further comprising a coupling out circuit via which said evaluator is connected to said supply line for said coil.

4. Apparatus as defined in claim 1, and further comprising a display unit operatively connected to said evaluator.

5. Apparatus as defined in claim 1 wherein said generating means is an OR gate having two inputs and an output which communicates with said parallel resonant circuit, and further comprising an oscillator for providing a voltage, a first converter converting the voltage of said oscillator into positive pulses and supplying the positive pulses via a gate circuit to one of said inputs of said OR gate, and a second converter converting the voltage of said oscillator into negative pulses and supplying the negative pulses via a gate circuit to the other one of said inputs of said OR gate.

6. Apparatus as defined in claim 5, and further comprising a third converter having an input connected to said supply line for said coil for coupling out the resonant frequency from said parallel resonant circuit and an output, and a comparator having a first input connected to said output of said third converter and a second input supplied with at least a desired frequency.

7. Apparatus as defined in claim 6 wherein said second input of said comparator is supplied with more than one desired frequency.

8. Apparatus as defined in claim 6 wherein said comparator has an output delivering a status signal in correspondence with the position of said armature, and further comprising a line connecting said output of said comparator with an input of an AGC amplifier which controls the position of said armature.

9. Apparatus as defined in claim 1 wherein the coil-/armature magnetic system is a direct current system.

10. Apparatus as defined in claim 1 wherein the coil-/armature magnetic system is an alternating current system.

11. Apparatus as defined in claim 1 wherein the coil-/armature magnetic system is an electromagnet.

12. Apparatus as defined in claim 1 wherein said additional signal introduced into said resonant circuit is a train of impulses.

* * * * *